United States Patent [19]

Barber et al.

[11] Patent Number: 4,966,870

[45] Date of Patent: Oct. 30, 1990

[54] METHOD FOR MAKING BORDERLESS CONTACTS

[75] Inventors: Jeffrey R. Barber, Pittsburgh, Pa.; Charles P. Breiten, Manassass, Va.; David Stanasolovich, Manassas, Va.; Jacob F. Theisen, Manassas, Va.

[73] Assignee: International Business Machines Corporation, Armonk, N.Y.

[21] Appl. No.: 391,399

[22] Filed: Aug. 8, 1989

Related U.S. Application Data

[63] Continuation of Ser. No. 181,354, Apr. 14, 1988, abandoned.

[51] Int. Cl.$^5$ .......................................... H01L 21/465
[52] U.S. Cl. .................................... 437/228; 437/241; 437/240
[58] Field of Search ............... 437/200, 241, 189, 190, 437/193, 194, 195, 196, 238, 240, 245, 246; 156/652, 653, 565, 657; 357/71; 148/DIG. 9

[56] References Cited

U.S. PATENT DOCUMENTS

| | | | |
|---|---|---|---|
| 4,040,083 | 8/1977 | Saiki et al. | 437/195 |
| 4,259,366 | 3/1981 | Balasubramanian | 437/193 |
| 4,273,805 | 6/1981 | Dawson et al. | 437/203 |
| 4,446,194 | 5/1984 | Candelaria et al. | 437/195 |
| 4,502,210 | 3/1985 | Okumura | 437/195 |
| 4,507,852 | 4/1985 | Karalkar | 437/195 |
| 4,523,372 | 6/1985 | Balda | 437/195 |
| 4,536,949 | 8/1985 | Takayama | 437/195 |
| 4,581,101 | 4/1986 | Senone | 156/657 |
| 4,616,401 | 10/1986 | Takeuchi | 437/193 |
| 4,619,038 | 10/1986 | Pintchovski | 437/193 |
| 4,686,000 | 8/1987 | Heath | 437/40 |
| 4,717,449 | 1/1988 | Erie | 437/195 |
| 4,767,724 | 8/1988 | Kim | 437/195 |

FOREIGN PATENT DOCUMENTS

| | | | |
|---|---|---|---|
| 137636 | 10/1981 | Japan . | |
| 0119851 | 7/1984 | Japan | 437/195 |
| 0169151 | 9/1984 | Japan | 437/195 |
| 0195844 | 11/1984 | Japan | 437/978 |
| 0037150 | 2/1985 | Japan | 437/978 |
| 0042847 | 3/1985 | Japan | 437/978 |

OTHER PUBLICATIONS

"An Etch Process with High $SiO_2$ to $Si_3N_4$ Etch Selectivity", Research Disclosure, Feb. 1988.
Rangelon et al, "Secondary Effects . . . ", Microelectronic Engineering 5 (1986), pp. 387-394.
Coburn, J., "Plasma Assisted Etching", Plasma Chem and Plasma Proc., vol. 2, No. 1, 1982, pp. 1-41.

Primary Examiner—Brian E. Hearn
Assistant Examiner—Trung Dang
Attorney, Agent, or Firm—Jesse L. Abzug

[57] ABSTRACT

A process for making borderless contacts through an insulating layer to active regions of a semiconductor device is disclosed. After deposition of a silicon nitride layer and an insulation glass layer on a substrate coating semiconductor devices, the contact windows are etched. The windows are etched through the glass layer with $BCl_2$ or $CHF_3/CF_4$ etch gases. Next, the windows are etched through the silicon nitride with $CH_3F$ or $O_2/CHF_3$ gases.

16 Claims, 2 Drawing Sheets

METHOD FOR MAKING BORDERLESS CONTACTS

This application is a continuation of application Ser. No. 181,354, filed Apr. 14, 1988, now abandoned.

BACKGROUND OF THE INVENTION

1. Field of the Invention

This invention relates to a process for making contact windows in a semiconductor device. More particularly, a process for defining borderless contact windows through a borophosphosilicate glass layer (BPSG) and a silicon nitride layer to allow contacts to an underlying conductive layer is disclosed.

2. Description of the Related Art

Traditionally, in the manufacture of integrated circuits, the contacts to polysilicon layers and diffusion layers are designed such that the polysilicon and diffusion layers have a border region around their edges. Borders around the contacts are used primarily to insure that under worse case conditions, the polysilicon and diffusion contact windows will always fall on top of the polysilicon and diffusion layers. If the border is not used, the contacts, due to normal process variations, may fall partially on the polysilicon or diffusion regions and partially over the field oxide. If this occurs, the field oxide may be consumed during an overetch and a metal to substrate leakage path may be formed.

While borders around contact windows are advantageous for assuring proper registration of the contacts and protecting the underlying silicon and field regions, they do have an undesirable effect in limiting the maximum number of integrated circuits that can be packed into a given area. This limitation can be illustrated by the following example. If a standard bordered process has a one micron minimum dimension contact and a one micron minimum dimension polysilicon line, a one micron border then must be placed around each contact. As a result, the polysilicon pad over which the contacts are placed must be approximately three microns in each dimension, or nine square microns. In contrast, a borderless process would not require any borders around the polysilicon contact. Therefore, a minimum dimension polysilicon line, in this case a one micron polysilicon line, could be used to make contact. As a result, the borderless technology would save approximately eight square microns per contact structure as compared to a bordered technology. This advantage is graphically shown in the comparison between the prior art contact structures shown in FIG. 1 and the borderless contact structure as taught herein in FIG. 2.

Obviously, the borderless contact process will allow an increased level of circuit integration and hence more of an increased density in chips. Therefore, it is desirable to provide a process for making borderless contacts and conserving real estate on a chip.

OBJECTS OF THE INVENTION

It is an object of the invention to provide a process for making borderless contact windows on a semiconductor chip.

It is a further object of the invention to provide a process for making borderless contacts through a borophosphosilicate glass layer and an underlying silicon nitride layer.

It is a further object of the invention to provide a process for making contacts to a titanium disilicide layer.

SUMMARY OF THE INVENTION

After a self-aligned, silicide layer has been formed over already fabricated polysilicon and diffusion regions, a 750 Angstrom layer of silicon nitride is deposited by low pressure chemical vapor deposition. Next, a layer of BPSG is deposited and reflowed in a steam atmosphere to produce an approximately planar surface. A contact level layer of photoresist is applied, and the contact level pattern is lithographically defined in the resist. The first step of the contact etch is accomplished using a boron trichloride $BCL_3$ etch gas which selectively etches BPSG without etching the underlying silicon nitride. This step is carried out until the diffusion contact, which is the deeper of the two contacts, reaches endpoint. After the diffusion contact endpoint has been reached, the second etch step is initiated using a $CHF_3/O_2$ mixture which etches silicon nitride with a very high etch rate ratio to both BPSG and titanium disilicide. This etch is continued until the silicon nitride is removed from both contact regions.

BRIEF DESCRIPTION OF THE DRAWINGS

The foregoing and other advantages of the invention will be more fully understood with reference to the description of the best mode and the drawing wherein.

DESCRIPTION OF THE BEST MODE FOR CARRYING OUT THE INVENTION

Figure 1:
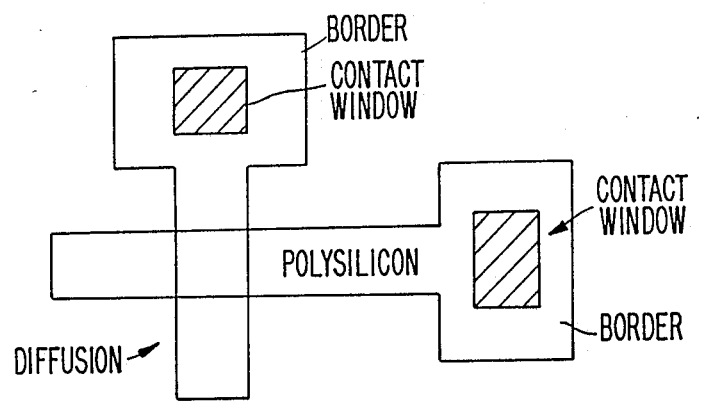
FIG. 1 is a top view of a prior art bordered contact with polysilicon wiring layer.
Figure 2:
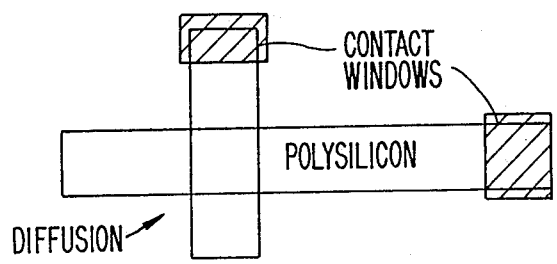
FIG. 2 is a top view of a borderless contact with polysilicon wiring layer.
Figure 3A:
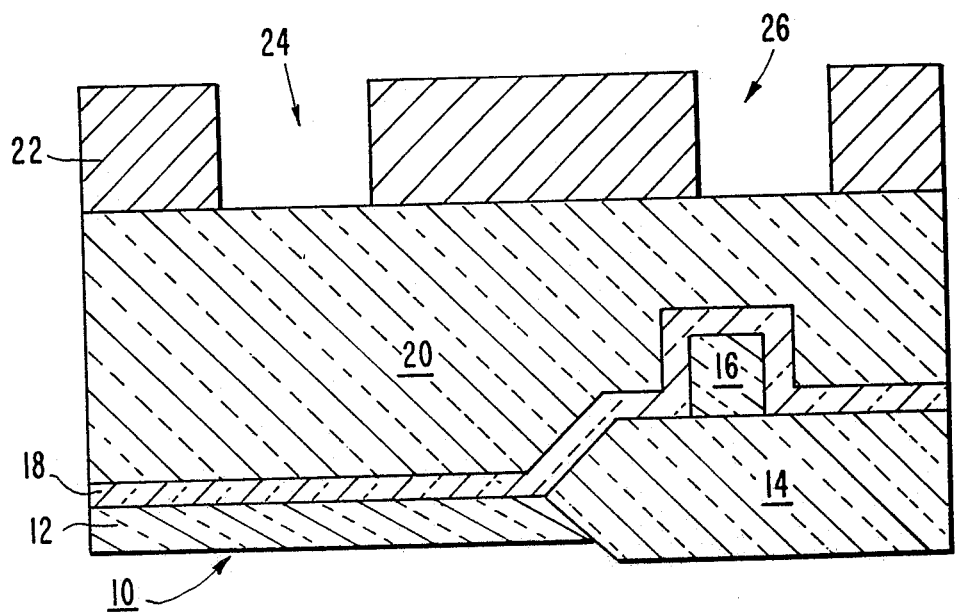
FIGS. 3A–C are cross-sectional views of a semiconductor device structure at various process stages.

Referring to FIG. 3A, an FET semiconductor device structure has been fabricated in silicon wafer 10 according to conventional CMOS processes. Diffusion region 12, field oxide region 14 and polysilicon interconnect line 16 are shown. Diffusion region 12 can be made of silicon, any conducting metal that is commonly used for diffusion areas, or refractory metal silicides such as titanium disilicide, tungsten disilicide, cobalt disilicide, etc. In this preferred embodiment, diffusion region 12 is comprised of titanium disilicide.

In the next processing step, a silicon nitride layer 18 is deposited by low pressure chemical vapor deposition (LPCVD) techniques. Silicon nitride layer 18 is approximately 750 to 1000 Angstroms in thickness and serves two primary purposes. First, it protects the titanium disilicide in the diffusion region 12 from damage or oxidation during the subsequent steam anneal steps, and second, it serves as an etch stop for the subsequent contact etch. This second function is critical to the creation of the borderless contacts.

A layer 20 of BPSG is deposited by either atmospheric pressure chemical vapor deposition or LPCVD methods. The BPSG composition is comprised of four to six mole percent phosphorus and four to six mole percent boron. The thickness of the BPSG 20 can range from approximately 6000 Angstroms to 11,000 Angstroms. The thickness is chosen such that a minimum thickness of BPSG of approximately 5000 Angstroms exists over the polysilicon lines 16 which run over the field oxide 14. The BPSG 20 is used for two purposes. First, it serves as a passivation layer to protect the conducting regions, and second, it will be subsequently annealed in a steam atmosphere to produce a planar surface. A planar surface is desirable for optimum metal coverage. The BPSG 20 is annealed in a steam atmosphere at 800° C. for approximately 30 minutes. The anneal can be performed at either atmospheric pressure or at a high pressure of 10 to 20 atmospheres.

Following the steam anneal of BPSG 20, the contact level photoresist 22 is applied. This photoresist layer 22 can be either positive or negative. The thickness can range between 15,000 and 17,000 Angstroms. A contact level pattern is then defined in the photoresist layer 22 by conventional optical lithography, E-beam lithography, or x-ray lithography and subsequent development. The resulting pattern of contact windows 24, 26 can be seen in FIG. 3A.

Figure 3B:
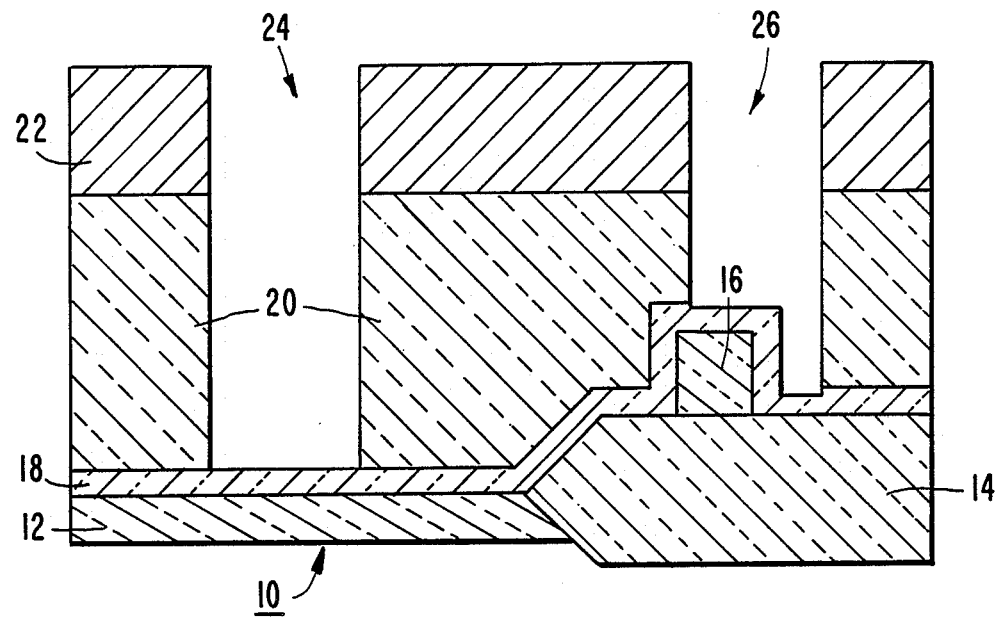

Referring now to FIGS. 3B and C, the contact etch process is comprised of three steps. The initial step serves to remove moisture from a reactive ion etch chamber. This is critical for the reproducibility of the process. The second step serves to etch the BPSG 20 until the silicon nitride layer 18 is exposed in both the deep contact 24 over the diffusion 12 and the contact 26 over the polysilicon 16. The third step removes the remainder of the silicon nitride layer 18 with a high degree of selectivity to BPSG, field oxide 14, and titanium disilicide in diffusion region 12.

Specifically, Step 1 is a reactive ion etch step with the following process conditions:

| | |
|---|---|
| DC bias voltage | 0 volts |
| Power | 0 watts |
| Etch gas | Boron trichloride (BCL$_3$) |
| Flow rate | 20 SCCM |
| Pressure | 100 mTorr |
| Temperature | 26° C. |
| Time | 10 minutes |

The presence of BCL$_3$ is the critical factor in step 1 for the removal of moisture from the reactor. Power is not used in this step so that the photoresist mask is not damaged.

Step 2 is comprised of the following process conditions:

| | |
|---|---|
| DC bias voltage | 200 volts |
| Power | ? |
| Etch gas | BCL$_3$ |
| Flow rate | 20 SCCM |
| Pressure | 30 mTorr |
| Temperature | 15° C. |
| Time | Endpoint |

This particular step is used to etch the BPSG 20 with a high degree of selectivity to the underlying silicon nitride layer 18. The etch rate ratio of BPSG to silicon nitride is approximately 11:1. At this point the silicon nitride layer 18 is exposed in all contact areas (FIG. 3B).

Step 3 is a reactive ion etch process performed with the following process conditions:

| | |
|---|---|
| Power | 500 watts |
| Etch gas | Oxygen |
| Flow rate | 44 SCCM |
| Etch gas | CHF$_3$ |
| Flow rate | 6 SCCM |
| Pressure | 50 mTorr |
| Temperature | 20° C. |
| Time | Endpoint |

The etch rate ratios achieved with these process conditions are as follows:

Si$_3$N$_4$:SiO$_2$-16:1

Si$_3$N$_4$:TiSi$_2$-8:1

Figure 3C:
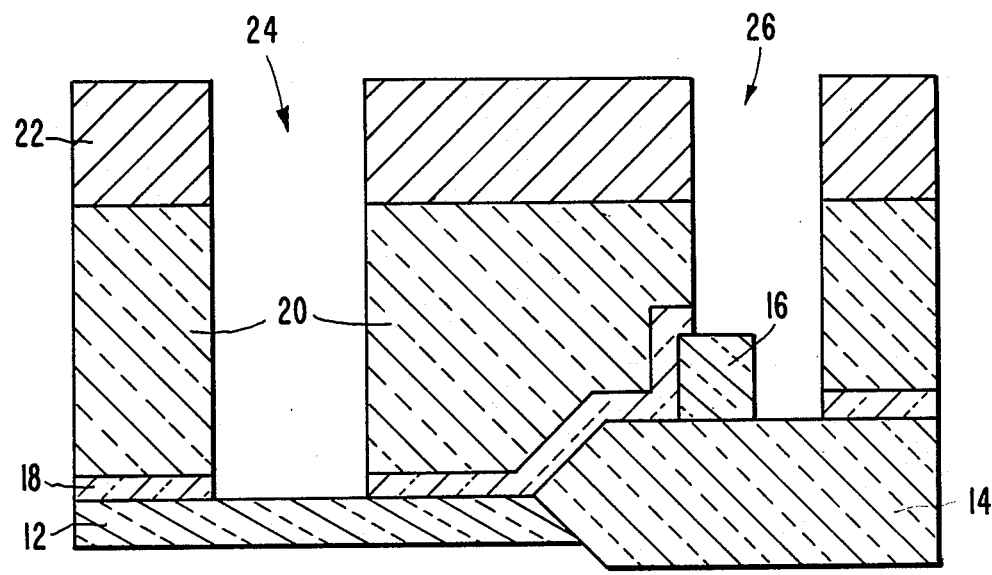

Step 3 is carried out until the silicon nitride 18 is removed from all contact areas 24, 26, exposing the conductive regions. FIG. 3C represents the final borderless contact etch structure. Metallization and contact metallurgy are performed as in the prior art.

In an alternative embodiment, the following etch conditions can be substituted for those listed under Step 3.

| | |
|---|---|
| Power | 400–500 watts |
| Etch gas | CH$_3$F |
| Flow rate | 50 SCCM |
| Pressure | 30 mTorr |
| Temperature | 20° C. |
| Time | Endpoint |

The etch rate ratios achieved are as follows:

Si$_3$N$_4$:SiO$_2$-30:1

Si$_3$N$_4$:TiSi$_2$-20:1

The high etch selectivity of Si$_3$N$_4$ to SiO$_2$ prevents the consumption of the field oxide, thereby providing a process for borderless polysilicon contacts.

Additionally, the high etch selectivity of Si$_3$N$_4$ to SiO$_2$ prevents the removal of the SiO$_2$ bird's beak region, thereby allowing the use of borderless diffusion contacts.

The high etch selectivity of Si$_3$N$_4$ to TiSi$_2$ is necessary to prevent removal of the TiSi$_2$ conduction regions.

In another preferred embodiment, the following process conditions can be substituted for Step 2 above:

| | |
|---|---|
| Power | 1000 watts |
| Etch gas | CHF$_3$ |
| Flow rate | 90 SCCM |
| Etch gas | CF$_4$ |
| Flow rate | 20 SCCM |
| Pressure | 50 mTorr |
| Temperature | 20 ° C. |
| Time | Endpoint |

When these conditions are used, Step 1 above is not required.

The etch rate ratio of BPSG to silicon nitride is 15:1.

While the invention has been described with reference to a referred embodiment, it will be understood by those skilled in the art that various changes in detail may be made therein without departing from the spirit, scope and teaching of the invention. Accordingly, the process herein disclosed is to be considered merely as illustrative, and the invention is to be limited only as specified in the claims.

What is claimed is:

1. A method for making borderless contact windows through an insulating layer and a diffusion protecting/etch stop layer comprising the steps of:
   providing a semiconductor device having active regions;

depositing a diffusion protecting/etch stop layer over said active regions;

depositing an insulating layer over said diffusion protecting/etch stop layer;

depositing a layer of photoresist over said insulating layer;

lithographically defining a pattern of contact windows in said photoresist layer;

selectively etching said pattern of contact windows into said insulating layer with $BCl_3$ at a selectivity of at least about 11:1; and etching said pattern of contact windows into said diffusion protecting/etch stop layer with $CH_3F$ or $O_2/CHF_3$.

2. The process as claimed in claim 1 wherein said semiconductor device is an FET having source, drain and gate regions.

3. The process as claimed in claim 1 wherein said diffusion protecting/etch stop layer is silicon nitride.

4. The process as claimed in claim 3 wherein said insulating layer is borophosphosilicate glass.

5. The process as claimed in claim 2 wherein said source and drain regions include a layer of silicide.

6. The process as claimed in claim 5 wherein said silicide is selected from the group consisting of tungsten disilicide, cobalt disilicide, and titanium disilicide.

7. A process for making semiconductor device interconnections comprising the steps of:

providing a plurality of semiconductor devices having active regions;

depositing a diffusion protecting/etch stop layer over said active regions;

depositing an insulating layer over said diffusion protecting/etch stop layer;

depositing a layer of photoresist over said insulating layer;

lithographically defining a pattern of contact windows in said photoresist layer;

selectively etching said pattern of contact windows into said insulating layer with $BCl_3$ at a selectivity of at least 11:1;

etching said pattern of contact windows into said diffusion protecting/etch stop layer with $CH_3F$ or $O_2/CHF_3$; and depositing at least one electrical interconnection layer.

8. The process as claimed in claim 7 wherein said semiconductor devices are FET's having source, drain and gate regions.

9. The process as claimed in claim 7 wherein said diffusion protecting/etch stop layer is silicon nitride.

10. The process as claimed in claim 9 wherein said insulating layer is borophosphosilicate glass.

11. The process as claimed in claim 8 wherein said source and drain regions include a layer of silicide.

12. The process as claimed in claim 11 wherein said silicide is selected from the group consisting of tungsten disilicide, cobalt disilicide, and titanium disilicide.

13. A method for making borderless contact windows through an insulating layer and a diffusion protecting/etch stop layer comprising the steps of:

providing a semiconductor device having active regions;

depositing a diffusion protecting/etch stop layer of silicon nitride over said active regions;

depositing an insulating layer of borophosphosilicate glass over said silicon nitride layer;

depositing a layer of photoresist over said borophosphosilicate glass layer;

lithographically defining a pattern of contact windows in said photoresist layer;

selectively etching at a selectivity of at least about 11:1 said pattern of contact windows into said borophosphosilicate glass layer using $BCl_3$ as the etch gas to expose the silicon nitride in said pattern of contact windows; and etching the silicon nitride remaining in said pattern of contact windows using $CH_3F$ or $O_2/CH_3$.

14. The process as claimed in claim 4 wherein said borophosphosilicate glass (BPSF) is etched with $BCL_3$ at a flow rate of 20 SCCM and with an etch rate ratio of BPSG to silicon nitride of 11:1.

15. The process as claimed in claim 10 wherein said borophosphosilicate glass (BPSG) is etched with $BCL_3$ at a flow rate of 20 SCCM and with an etch rate ratio of BPSG to silicon nitride of 11:1.

16. The process as claimed in claim 13 wherein said borophosphosilicate glass (BPSG) is etched with $BCL_3$ at a flow rate of 20 SCCM and with an etch rate ratio of BPSG to silicon nitride of 11:1.

* * * * *